United States Patent
Kovacevic et al.

(10) Patent No.: US 12,320,866 B2
(45) Date of Patent: Jun. 3, 2025

(54) REAL TIME LIVE LINE MEASUREMENT OF METROLOGICAL PROPERTIES OF CURRENT TRANSFORMERS

(71) Applicants: Uros Kovacevic, Belgrade (RS); Vladeta Milenkovic, Niš (RS)

(72) Inventors: Uros Kovacevic, Belgrade (RS); Vladeta Milenkovic, Niš (RS)

( * ) Notice: Subject to any disclaimer, the term of this patent is extended or adjusted under 35 U.S.C. 154(b) by 142 days.

(21) Appl. No.: 18/043,240

(22) PCT Filed: Aug. 12, 2021

(86) PCT No.: PCT/EP2021/072535
§ 371 (c)(1),
(2) Date: Feb. 27, 2023

(87) PCT Pub. No.: WO2022/043088
PCT Pub. Date: Mar. 3, 2022

(65) Prior Publication Data
US 2024/0036121 A1   Feb. 1, 2024

(30) Foreign Application Priority Data
Aug. 28, 2020 (GB) .................................. 2013593

(51) Int. Cl.
*G01R 31/62* (2020.01)
*G01R 19/25* (2006.01)
(Continued)

(52) U.S. Cl.
CPC ......... *G01R 31/62* (2020.01); *G01R 19/2513* (2013.01); *G01R 21/1331* (2013.01); *G01R 22/063* (2013.01)

(58) Field of Classification Search
CPC .................... G01R 31/62; G01R 19/2513; G01R 21/1331; G01R 22/063; G01R 15/188; G01R 15/207; G01R 15/186; G01R 35/02
See application file for complete search history.

(56) References Cited

U.S. PATENT DOCUMENTS

| 4,827,272 A | 5/1989 | Davis |
| 7,327,133 B2 * | 2/2008 | Baker .................. G01R 15/202 |
| | | 324/117 R |

(Continued)

FOREIGN PATENT DOCUMENTS

| CN | 108508254 A | 9/2018 |
| JP | 2009002705 A | 1/2009 |

OTHER PUBLICATIONS

International Preliminary Report on Patentability dated Mar. 9, 2023 from corresponding International Patent Application No. PCT/EP2021/072535, 7 pages.

(Continued)

*Primary Examiner* — Jermele M Hollington
*Assistant Examiner* — Zannatul Ferdous
(74) *Attorney, Agent, or Firm* — Ruggiero McAllister & McMahon LLC

(57) ABSTRACT

An online live line method of analysing metrological properties of a high voltage current transformer configured to transform an upstream current into a downstream current, the method comprising obtaining a series of upstream current data points during a first time period using an upstream current sensor, and attributing an upstream time stamp provided by an upstream global navigation satellite system (GNSS) signal receiver to each one of the series of upstream current data points to obtain a time-stamped series of upstream current data points. The method further comprises obtaining a series of downstream current data points during the first time period using a downstream current sensor; attributing a downstream time stamp provided by a downstream global navigation satellite system (GNSS) signal receiver to each one of the series of downstream current data points to obtain a time-stamped series of downstream current data points; and calculating a current transformer phase displacement error between the time-stamped series of (Continued)

upstream current data points and the time-stamped series of downstream current data points. The method further comprises calculating a current transformer ratio error by comparing a rated ratio of the current transformer with a measured ratio determined using the time-stamped series of upstream current data points and the time-stamped series of downstream current data points.

19 Claims, 17 Drawing Sheets

(51) Int. Cl.
*G01R 21/133* (2006.01)
*G01R 22/06* (2006.01)

(56) References Cited

U.S. PATENT DOCUMENTS

| | | | | |
|---|---|---|---|---|
| 7,518,529 | B2* | 4/2009 | O'Sullivan | G01R 15/142 |
| | | | | 709/224 |
| 2005/0111027 | A1* | 5/2005 | Cordery | G06T 1/0042 |
| | | | | 358/1.14 |
| 2007/0052426 | A1 | 3/2007 | Wells et al. | |
| 2009/0188349 | A1* | 7/2009 | Hanning | H02G 1/1241 |
| | | | | 81/9.43 |
| 2010/0188240 | A1 | 7/2010 | Wells | |
| 2010/0283491 | A1* | 11/2010 | Zurek | G01R 27/20 |
| | | | | 324/127 |
| 2013/0187636 | A1 | 7/2013 | Kast et al. | |
| 2014/0176164 | A1* | 6/2014 | Davis | G01R 19/0084 |
| | | | | 324/709 |
| 2017/0162959 | A1* | 6/2017 | Badia | H01R 12/7023 |
| 2018/0252758 | A1 | 9/2018 | Turner | |
| 2020/0129198 | A1* | 4/2020 | Davison | A61B 34/71 |
| 2020/0212709 | A1 | 7/2020 | de Callafon et al. | |

OTHER PUBLICATIONS

Great Britain Search Report dated Sep. 12, 2022 from corresponding Great Britain Patent Application No. 2204693.2, 10 pages.
International Search Report dated Mar. 18, 2022 from corresponding International Patent Application No. PCT/EP2021/072535, 7 pages.
Written Opinion dated Mar. 18, 2022 from corresponding International Patent Application No. PCT/EP2021/072535, 8 pages.
Great Britain Search Report dated Jul. 20, 2021 from corresponding Great Britain Patent Application No. 2013593.5, 2 pages.
Great Britain Combined Search and Examination Report dated Feb. 12, 2021 from corresponding Great Britain Patent Application No. 2013593.5, 6 pages.
Kusic et al; "Measurement of Power System Phase Differences by Means of GPS Timing", Electric Power Quality and Supply Reliability (PQ), IEEE, Aug. 29, 2016, pp. 297-300.
Wu et al; "Three-phase Instrument Transformer Calibration with Synchronized Phasor Measurements", Innovative Smart Grid Technologies (ISGT), Jan. 16, 2012, pp. 1-6.

* cited by examiner

REAL TIME LIVE LINE MEASUREMENT OF METROLOGICAL PROPERTIES OF CURRENT TRANSFORMERS

CROSS-REFERENCE TO RELATED APPLICATION

This application is a national stage, filed under 35 U.S.C. § 371, of International Application No. PCT/EP2021/072535, filed on Aug. 12, 2021, which claims priority to Great Britain Patent Application No. 2013593.5, filed on Aug. 28, 2020, the disclosures of which are hereby incorporated by reference in their entireties.

BACKGROUND OF THE DISCLOSURE

1. Field of the Disclosure

A method and associated apparatus for obtaining real time live line measurement of metrological properties of current transformers is disclosed.

2. Description of the Related Art

Metrological properties of current transformers, especially medium and high voltage current transformers like those in use in electric power systems and in electricity substations, can deteriorate with age and use. It is helpful to be able to test metrological properties of current transformers to ensure that they are within acceptable limits and to identify those that are outside acceptable limits.

It is known to test metrological properties of current transformers when the transformers are out of use. Such tests may require disconnection of the current transformer from the power network, unbundling of conductors and in most cases the consequential interruption in the delivery of electricity. In short, it is disruptive and costly to take a current transformer out of use. Moreover, since such tests that take place with the current transformer out of use, they are unable to test the current transformer in real operating conditions with real currents, in the presence of high voltage, and secondary burdens.

SUMMARY OF THE DISCLOSURE

Against this background, in a first aspect of the disclosure there is provided an online live line method of analysing metrological properties of a high voltage current transformer configured to transform an upstream current into a downstream current, the method comprising:
  obtaining a series of upstream current data points during a first time period using an upstream current sensor;
  attributing an upstream time stamp provided by an upstream global navigation satellite system (GNSS) signal receiver to each one of the series of upstream current data points to obtain a time-stamped series of upstream current data points;
  obtaining a series of downstream current data points during the first time period using a downstream current sensor;
  attributing a downstream time stamp provided by a downstream GNSS signal receiver to each one of the series of downstream current data points to obtain a time-stamped series of downstream current data points;
  calculating a current transformer phase displacement error between the time-stamped series of upstream current data points and the time-stamped series of downstream current data points;
  calculating a current transformer ratio error by comparing a rated ratio of the current transformer with a measured ratio determined using the time-stamped series of upstream current data points and the time-stamped series of downstream current data points.

In this way, metrological properties of the current transformer under test may be obtained while the current transformer is in use using standard low-cost current sensors. This removes a need for the transformer to be taken out of use in order to be tested, which in turn may increase the feasibility of more frequent testing. Furthermore, the use of GNSS time stamp data facilitates a degree of time measurement accuracy within less than 100 ns, potentially as low as 10 ns.

In this way, there is a relatively low cost and complexity of hardware required at the current transformer location. The calculations of phase displacement and transformer ratio error can be performed remotely.

In some embodiments, the measured ratio may be a ratio of:
  a root mean square value of the series of upstream data points; to
  a root mean square value of the series of downstream data points.

In this way, straightforward mathematical operations may be performed on the data to achieve the measured ratio and thereby the transformer ratio error.

The current transformer phase displacement error may be proportional to a time difference between at least one pair of successive zero crossings of time stamped upstream current data and time stamped downstream current data, wherein accuracy of time reference is less than 100 nanoseconds and preferably approximately 10 nanoseconds.

The stream of upstream current data points and the stream of downstream current data points may comprises at least 20,000 data points per AC cycle, preferably 40,000 data points per AC cycle.

The method may further comprise compensating for measurement errors derived via a calibration process.

In this way, known errors in the measurement apparatus can be removed from the results.

The calibration process may comprise:
  using the upstream current sensor to sense a current in a calibration coil of a calibration circuit;
  using the downstream current sensor to a sense a current in a cable of the calibration circuit, the cable being in series with the calibration coil.

In this way, by using both sensors to sense currents in a single calibration circuit, errors resulting from the sensors themselves can be identified.

In a second aspect of the disclosure, there is provided an electrical measurement apparatus comprising:
  a primary sensing module comprising:
    a primary sensor configured to measure a primary current in a primary conductor of a current transformer in order to obtain a series of primary current data points; and
    a primary global navigation satellite system (GNSS) signal receiver configured to attribute a primary GNSS time stamp to each one of the series of primary current data points to obtain a primary series of time stamped data points; and a secondary sensing module comprising:
a secondary sensor configured to measure a secondary current in a secondary conductor of the current transformer in order to obtain a series of secondary current data points; and
a secondary GNSS signal receiver configured to attribute a secondary GNSS time stamp to each one of the series of secondary current data points to obtain a secondary series of time stamped data points;
wherein the primary sensing module is configured to transmit the primary series of time stamped data points to the secondary sensing module; and
wherein the secondary sensing module is configured:
to receive the primary series of time stamped data points;
to generate aggregated data comprising both the primary series of time-stamped data points and the secondary series of time-stamped current data points; and
to output the aggregated data.

In this way, the hardware required at the current transformer location is relatively low cost and low complexity. The calculations of phase displacement and transformer ratio error can be performed remotely.

The primary sensing module may be configured to sense a higher current than the secondary sensing module.

The primary sensing module may comprise electromagnetic shielding.

The secondary sensing module may comprise electromagnetic shielding.

The secondary sensing module may be further configured: to calculate, from the aggregated data, a ratio error and a phase displacement error; to output the ratio error and the phase displacement error.

The primary sensing module may comprise a primary wireless transmitter configured to transmit the primary series of time stamped data points to the secondary sensing module.

The secondary sensing module may comprise a secondary wireless receiver configured to receive the primary series of time stamped data points from the secondary sensing module.

The secondary sensing module may comprises a secondary wireless transmitter configured to transmit the aggregated data and/or to transmit the ratio error and the phase displacement error.

In a third aspect of the disclosure, there is provided a measuring head for measuring an electrical property of a conductor, comprising:
a sensor configured to measure the electrical property;
an upper jaw;
a lower jaw;
a mechanism for opening and closing the upper and lower jaws;
a first connecting element configured for connecting a rotatable rod;
a second connecting element configured for connecting a non-rotatable rod;
wherein the upper and lower jaws are configured to grasp the conductor in a closed position and to release the conductor in an open position; and
wherein the opening and closing of the jaws is actuated by rotation of the rotatable rod.

In this way, the jaws of the measuring head may straightforwardly grasp a conductor whose current is to be sensed. Furthermore, the grasping of the jaws may be actuated by a simple rotational movement. Moreover, the rotational movement may be provided from a distance. This may assist with access to the conductor to be tested. Further, it may allow a user actuating the jaws to be located at a safer distance from the live conductor that may be on a high voltage.

The measuring head may comprise an electric current sensor.

In the closed position, an aperture between the upper and lower jaws is configured to accommodate the conductor.

The aperture may be circular in cross section. Alternatively, the aperture may have any other suitable cross section suitable for accommodating the conductor whose current is to be measured.

The aperture may be formed at least in part by a first removable insert of a first one of the upper jaw and the lower jaw.

In this way, the jaw and its actuation may be independent of the insert for a specific conductor.

The first removable insert may be interchangeable with a range of first removable inserts so as to facilitate a range of aperture shapes and sizes. Thus, different apertures may be available to accommodate different dimensions and geometries of conductor.

The aperture may be formed at least in part by a second removable insert of a second one of the upper jaw and the lower jaw.

This may provide for a greater degree of options for different aperture dimensions and geometries.

As with the first removable insert, the second removable insert may be interchangeable with a range of second removable inserts so as to facilitate a range of aperture shapes and sizes.

The first connecting element and the second connecting element may together form a poka-yoke arrangement so as to prevent opposite engagement of first and second connecting elements by external engagement elements.

In a fourth aspect of the disclosure there is provided a mounting tool for actuating a measuring head located at a distal end of the mounting tool, the measuring head having jaws that open in response to rotation of a first connecting element in a first rotational direction and that close in response to rotation of the first connecting element in a second rotational direction opposite to the first rotational direction;
wherein the mounting tool comprises:
a rotatable rod extending along an elongate axis and configured at the distal end of the mounting tool to engage with the first connecting element of the measuring head;
a non-rotatable rod extending parallel to the first rod and configured at the distal end of the mounting tool to engage with a second connecting element of the measuring head;
such that:
(a) movement of the mounting tool in a first translational direction parallel to the elongate axis facilitates engagement of the rotatable and non-rotatable rods with the first and second connecting elements; and
(b) movement of the mounting tool in a second translational direction opposite to the first direction facilitates disengagement of the rotatable and non-rotatable rods with the first and second connecting elements;
wherein on engagement of the rotatable rod with the first connecting element and on engagement of the non-rotatable rod with the second connecting element, rotation of the rotatable rod facilitates rotation of the first connecting element while the non-rotatable rod prevents rotation of the measuring head.

In this way, engagement of the tool may be achieved through movement of the tool relative to the measuring head in a translational direction relative to the elongate axis of the tool while actuation of the measuring head may be achieved through rotational movement of the rotatable rod.

The mounting tool may further comprise a motor located at a proximal end of the mounting tool and configured to effect rotational movement of the rotatable rod.

The rotatable rod and the non-rotatable rod together may form a first poka-yoke arrangement that corresponds with a second poka-yoke arrangement of the first and second connecting elements thereby preventing engagement of the rotatable rod with the second connecting element and the non-rotatable rod with the first connecting element.

BRIEF DESCRIPTION OF THE DRAWINGS

Embodiments of the disclosure are now described with reference to the following figures.

DETAILED DESCRIPTION

Figure 1:
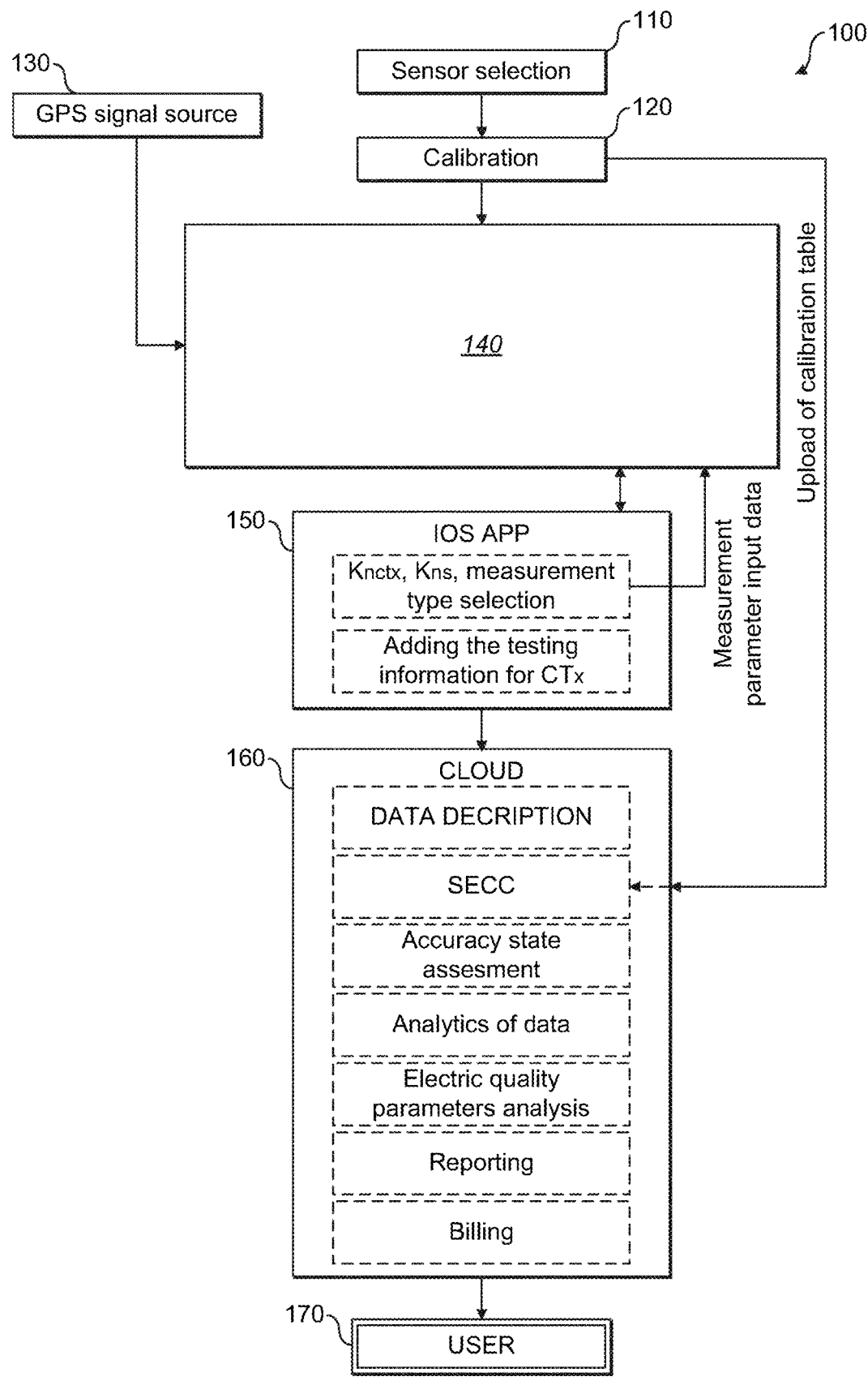
FIG. 1 is a high level flow chart showing aspects of the method of the disclosure.

A high level schematic representation of the method 100 of the disclosure is set out in FIG. 1.

The method 100 comprises a step of sensing module selection 110. In particular, it comprises selection of an appropriate upstream sensing module for sensing current in an upstream conductor that is upstream of the current transformer under test. It also comprises selection of an appropriate downstream sensing module for sensing current in a downstream conductor that is downstream of the current transformer under test. In each case the sensing module needs to be appropriate to the geometry of the relevant conductor and appropriate to the magnitude of the current being carried in the relevant conductor.

At step 120, a calibration process is performed. This is explained in more detail below. It is necessary for the calibration process to take place for the specific pair of sensing modules that have been selected. How frequently calibration is performed will depend on multiple factors.

At step 130 a signal is received from a global navigation satellite system (GNSS), such as a global positioning system (GPS™). The signal comprises highly accurate and precise time information which enables a precise and accurate time, to within 10 ns, to be attributed to events.

At step 140, measurement is performed by each of the two sensing modules. The measurement steps are set out in more detail at FIG. 2. For each sensing module, a large number of current readings is taken and each reading is attributed a precise time stamp, as provided by the GNSS signal.

One sensing module (either that configured to measure the upstream current or that configured to measure the downstream current) is a primary sensing module and the other is a secondary sensing module. The primary sensing module is configured to transmit its time-stamped current data points to the secondary sensing module. The secondary sensing module is configured to receive the time-stamped current data points from the primary sensing module. The secondary sensing module is also configured to package the time-stamped current data points from both primary and secondary sensing modules and output the aggregated data.

In preferred implementations, the secondary sensing module is configured to sense the lower of the upstream and downstream currents while the primary sensing module is configured to sense the higher of the upstream and downstream currents. This is because a higher current is likely to be on a higher voltage and to generate greater electromagnetic interference than a lower current. Therefore, it may be appropriate to carry out fewer functions (those of the primary sensor) in the location of higher electromagnetic interference and to carry out more functions (those of the secondary sensor) in the location on low voltage, and of lower electromagnetic interference.

Returning to FIG. 1, the aggregated data is used in the calculation of current transformer ratio error $\varepsilon_{ctx}$ and current transformer phase displacement error $\varphi_{ctx}$. The calculations may be performed locally at the secondary sensing module (as in the FIG. 1 example) or transmitted by the secondary sensing module to an independent processor (such as a cloud server) 160.

Calculation of the current transformer ratio error $\varepsilon_{ctx}$ and transformer phase displacement error $\varphi_{ctx}$ also requires additional information related to the type of test. This information may be provided by a user, perhaps using a mobile device 150 as shown in FIG. 1. The information provided by the user may be provided back to the sensing modules as well as onward to a processor.

This information will include the details of the current transformer under test and details of the type of test, including the following:

$k_{nctx}$—rated transformation ratio of the current transformer under test $k_{ns}$—rated transformation ratio of the sensor measurement type, including:
   number of measurements,
   time interval of measurements,
   mode of measurement (slow/fast)

$k_{nctx}$ and $k_{ns}$ are used to select the appropriate calibration table as well as for calculating of $\varepsilon_{ctx}$ and $\varphi_{ctx}$.

Ratio errors is defined as:

$$\varepsilon = \frac{k_n * I_s - I_p}{I_p} 100 (\%)$$

Phase displacement error cp is defined as:

$$\varphi = 2\pi f (t_{0s} - t_{0p})$$

where:
$k_n$ is rated transformation ratio ($kn = I_{pn}/I_{sn}$),
$I_{pn}$, $I_{sn}$ are rated values of the primary and secondary currents, respectively,
$I_p$, $I_s$ are effective values (true RMS) of primary and secondary current, respectively,
f is fundamental power frequency of the current in the network (50 Hz or 60 Hz),
$t_{0p}$ and $t_{0s}$ are successive zero crossing time (point) of primary and secondary current, respectively.

$$i = \frac{I_p}{I_{pn}} (r.u.) \text{ relative current}$$

Error compensation and correction may also be performed (in the FIG. 1 embodiment this is performed in the cloud 160), as explained further below.

Figure 2:
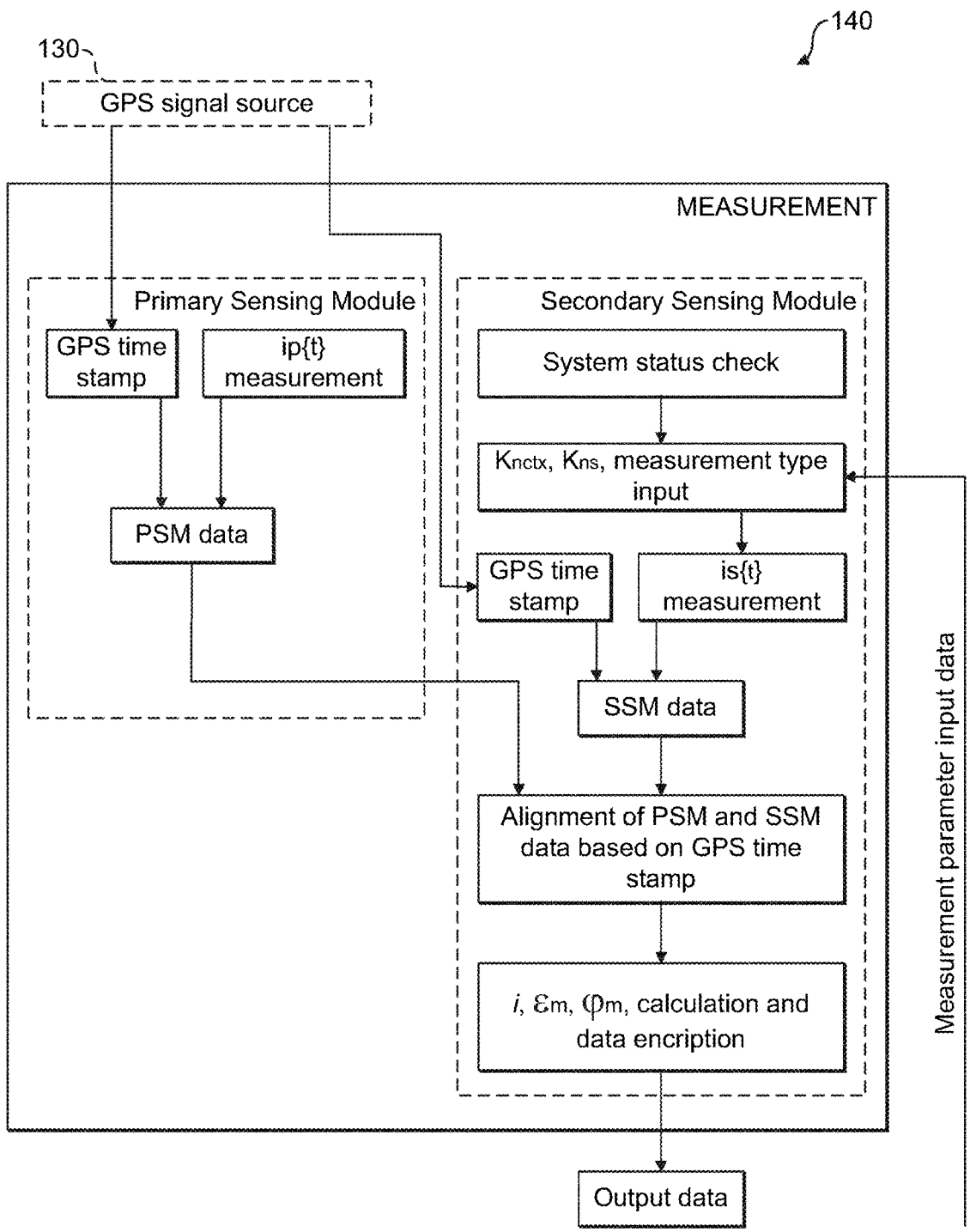
FIG. 2 shows in more detail the measurement cell of the flow chart of FIG. 1.
Figure 3:
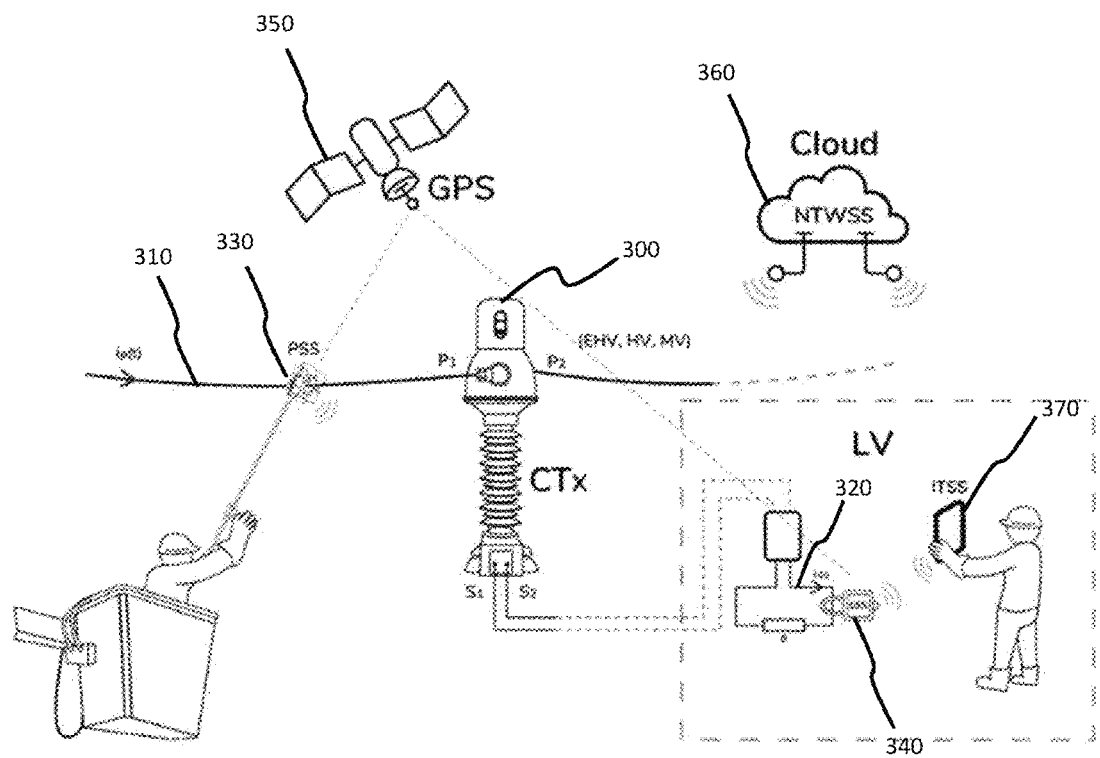
FIG. 3 shows aspects of apparatus in accordance with the present disclosure in situ relative to a current transformer under test for performing the method of the disclosure.

FIG. 3 shows a schematic diagram of a collection of apparatus for carrying out the method set out schematically in FIGS. 1 and 2.

In the FIG. 3 arrangement, the current transformer 300 under test is configured to transform an upstream current in an upstream conductor 310 (that may be part of a longer distance power network at a higher current and at a medium or high voltage) into a downstream current in a downstream conductor 320 (for local supply a shorter distance at a lower current and at low voltage, such as in the context of power meters, protective relays, SCADA systems, PMU system).

An upstream sensing module 330 is attached to the upstream conductor 310. A downstream sensing module 340 is attached to the downstream conductor 320. In the FIG. 3 arrangement, the upstream sensing module 330 is the primary sensing module 330 and the downstream sensing module 340 is the secondary sensing module 340.

A signal from a GNSS (such as a GPS 350) is received, separately, by the upstream sensing module 330 and the downstream sensing module 340. In this way, the current data values sensed by the upstream sensing module 330 and by the downstream sensing module 340 are each attributed a highly accurate time stamp provided by the GNSS signal.

The time-stamped upstream current data values are transmitted from the primary sensing module 330 to the secondary sensing module 340. The secondary sensing module 340 aggregates the time-stamped upstream current data values and the time-stamped downstream current data values and either processes them locally to determine ratio and phase displacement errors, or transmits them onward to a processor 360 which may be based in the cloud to perform the calculations.

(As mentioned above, it is not necessarily the case that the primary sensing module senses the upstream current and that the secondary sensing module senses the downstream current. If the current transformer were transforming from a lower current to a higher current, it may be that the primary sensing module senses the downstream current and the secondary sensing module senses the upstream current. The term secondary sensing module may be used to refer to the sensing module (whether upstream or downstream) that receives data from the primary sensing module and aggregates both the primary sensing module data and the secondary sensing module data.)

It is likely that the sensing module configured to measure the lower current, low voltage side of the current transformer is the one that will be the secondary sensing module. This is because it is further from the electric fields associated with the higher current conductor and high voltage around the conductor and may therefore require less electromagnetic shielding of the electronic components, including those associated with sending and receiving wireless signals, as discussed further below.

Figure 4:
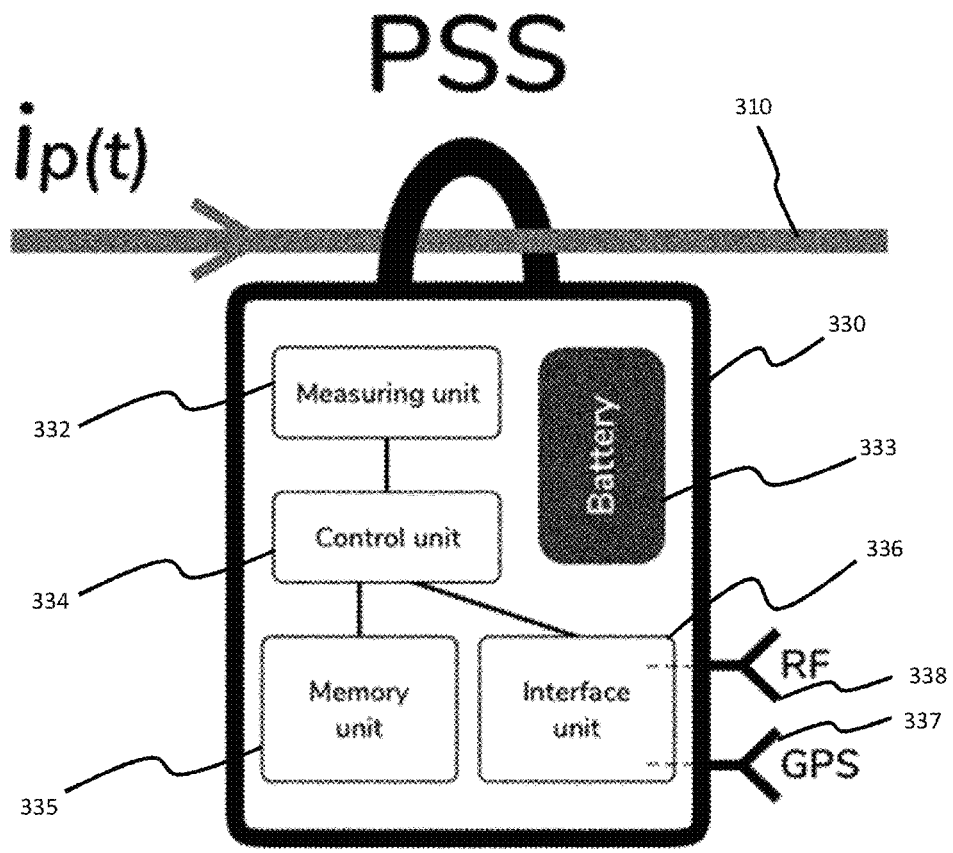
FIG. 4 shows a schematic representation of a primary sensing module for sensing a current.

FIG. 4 shows a high level schematic view of the features of the primary sensing module 330. The primary sensing module 330 may comprise a sensor (measuring unit) 332, a battery 333, a control unit 334, a memory unit 335 and an interface unit 336. The interface unit 336 may comprise a GNSS interface apparatus 337 and a radio frequency (RF) interface apparatus 338. The GNSS interface apparatus 337 may be configured to receive the GNSS data, including the time stamp data. The measuring unit 332 may be configured to obtain the current data. The control unit 334 may be configured to ensure that each current data is attributed with the time-stamp provided via the GNSS interface apparatus 337. The RF interface apparatus 338 may be configured to transmit the time-stamped current data to the secondary sensing module 340.

Figure 5:
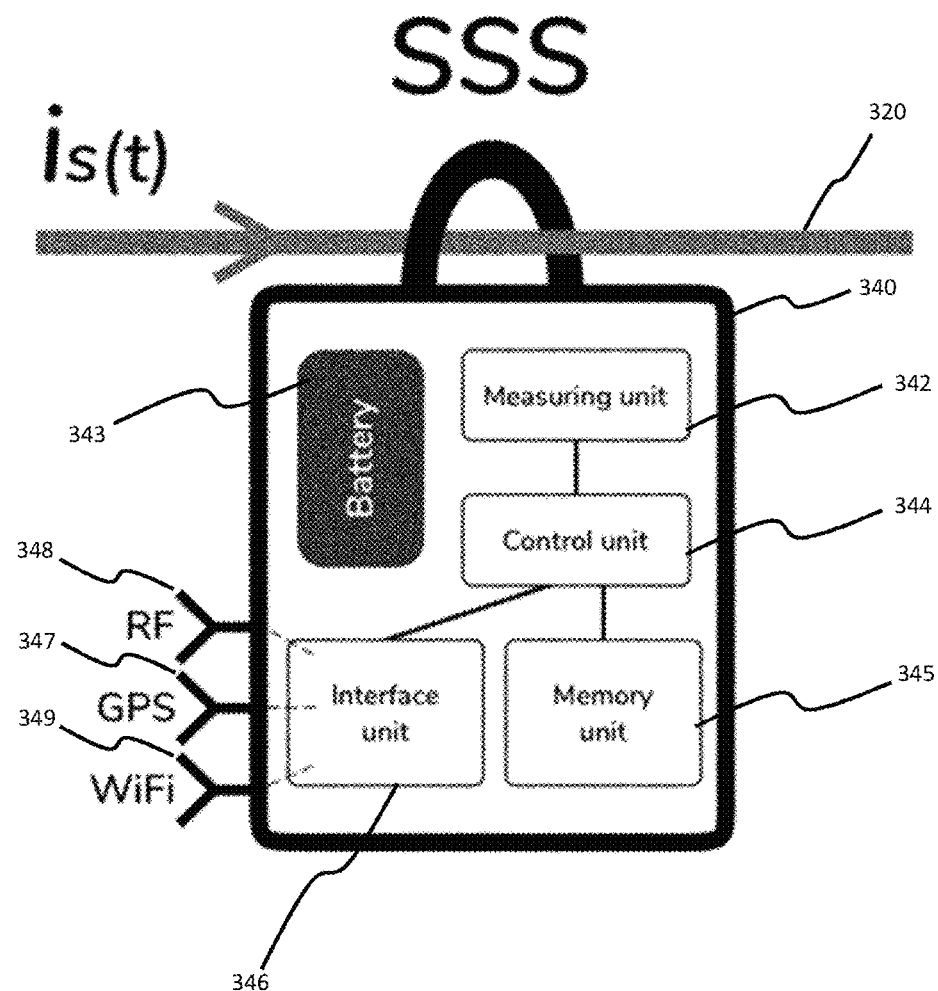
FIG. 5 shows a schematic representation of a secondary sensing module for sensing a current.

FIG. 5 shows a high level schematic view of the features of the secondary sensing module 340. The secondary sensing module 340 may comprise a sensor (measuring unit) 342, a battery 343, a control unit 344, a memory unit 345 and an interface unit 346. The interface unit 346 may comprise a GNSS interface apparatus 347, a radio frequency (RF) interface apparatus 348 and a WiFi apparatus 349. The GNSS interface apparatus 337 may be configured to receive the GNSS data, including the time stamp data. The measuring unit 342 may be configured to obtain the current data while the control unit 344 may be configured to ensure that each current data is attributed with the time-stamp provided via the GNSS interface apparatus 347. The RF interface apparatus 348 may be configured to receive the time-stamped current data to from the primary sensing module 330.

The control unit 344 of the secondary sensing module 340 may be configured to aggregate the time-stamped current data provided by the primary sensing module 330 with the time stamped current data provided by the secondary sensing module 340.

The aggregated data may be onwardly transmitted via the WiFi apparatus 349 (for example to the user's mobile device) for onward transmission to the cloud or may be onwardly transmitted via the RF interface apparatus 348 directly to the cloud without going via the user's mobile device. The WiFi apparatus 349 may be configured to receive data from the user's mobile device.

Figure 6:
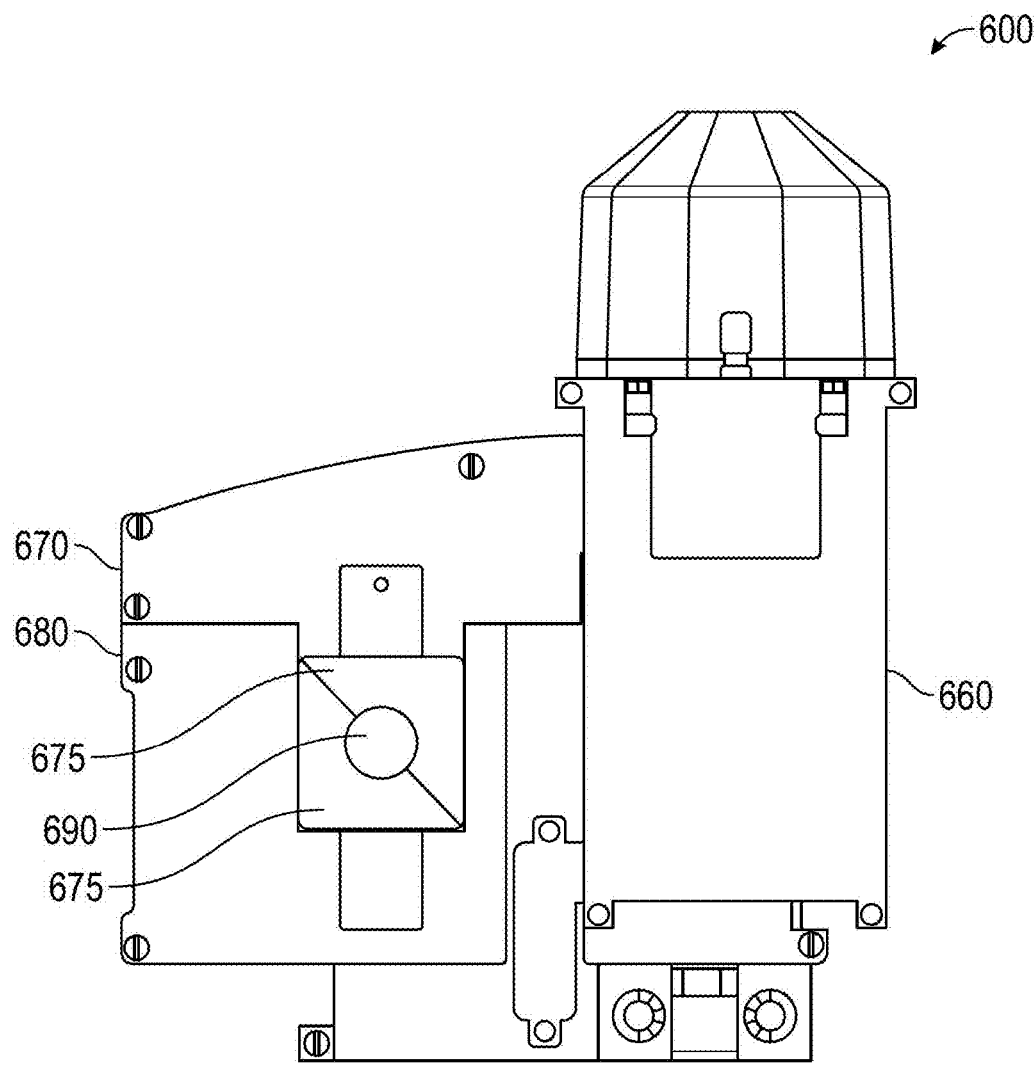
FIG. 6 shows a front view of a measuring head comprising sensor apparatus (either a primary sensing module or a secondary sensing module) for sensing high currents on a high voltage conductor in accordance with the present disclosure, shown in a closed configuration.

FIG. 6 shows a measuring head 600 in the form of a sensing module 600, such as a primary sensing module 330 or a secondary sensing module 340, wherein the sensing module 600 is configured to house a sensor for sensing a relatively high current. The sensing module 600 shown in FIG. 6 may be for use with a high current conductor on a high voltage.

The sensing module 600 comprises a housing 660 containing features including the sensor (measuring unit) 332, battery 333, control unit 334, memory unit 335 and interface unit 336 shown in FIG. 4.

Figure 7:
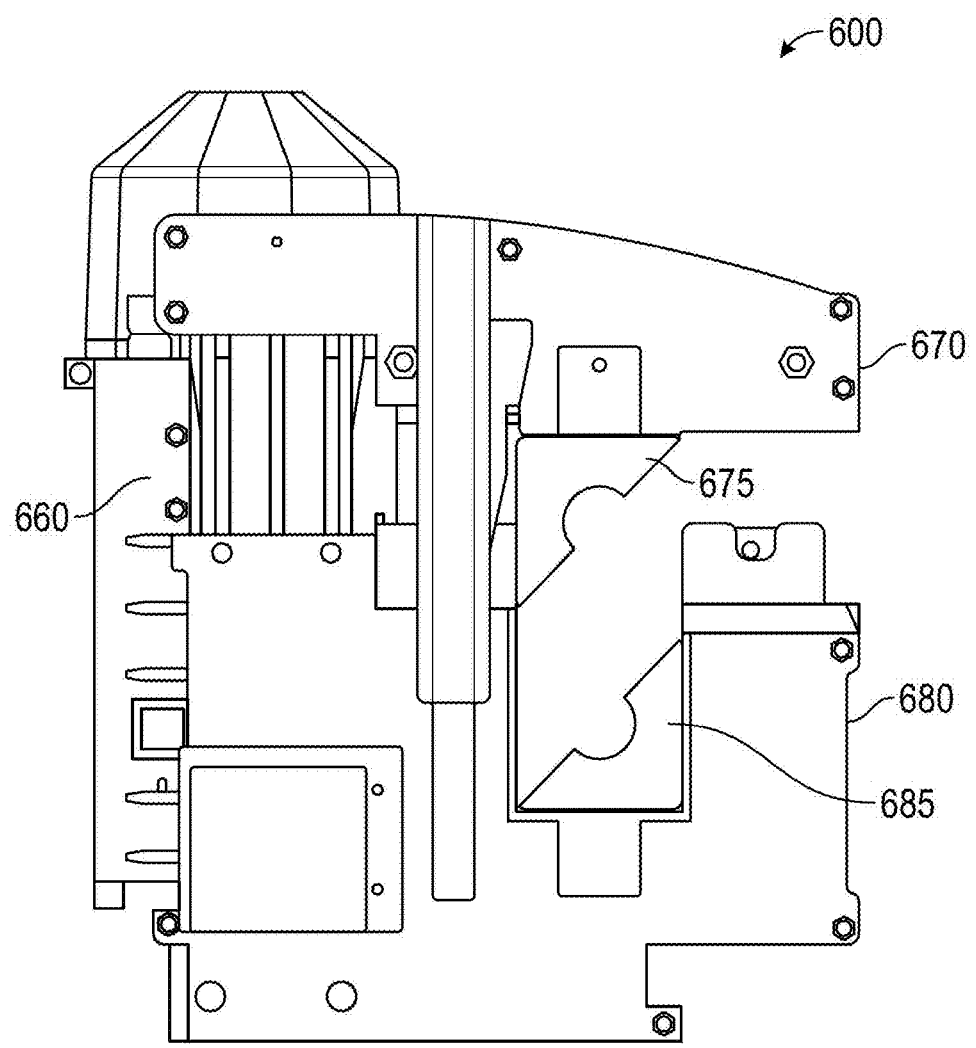
FIG. 7 shows a rear view of the measuring head of FIG. 6 in an open configuration.

The sensing module 600 also comprises a first jaw 670 and a second jaw 680 configured to rest adjacent each other in a closed position (as shown in FIG. 6) and to sit apart from each other in an open position (as shown in FIG. 7).

The first jaw 670 comprises a first substitutable insert 675 and the second jaw 680 comprises a second substitutable insert 685. With the first and second jaws 670, 680 in the closed position, the first and second substitutable inserts 675, 685 cooperate so as to form an aperture 690 defined in part by a profile of the first substitutable insert 675 and in part by a profile of the second substitutable insert 685. In the illustrated embodiment, the aperture 690 is circular (in cross section, cylindrical in three dimensions) and is configured to surround a conductor having a circular cross section of substantially the same diameter as that of the circular aperture.

Other substitutable inserts may be provided to accommodate conductors of different dimensions and geometries. In this way the sensing module 600 is independent of the dimensions and geometry of the conductor to be tested.

FIG. 7 shows the sensing module of FIG. 6 from an opposite direction and with the jaws in an open configuration.

Figure 8:
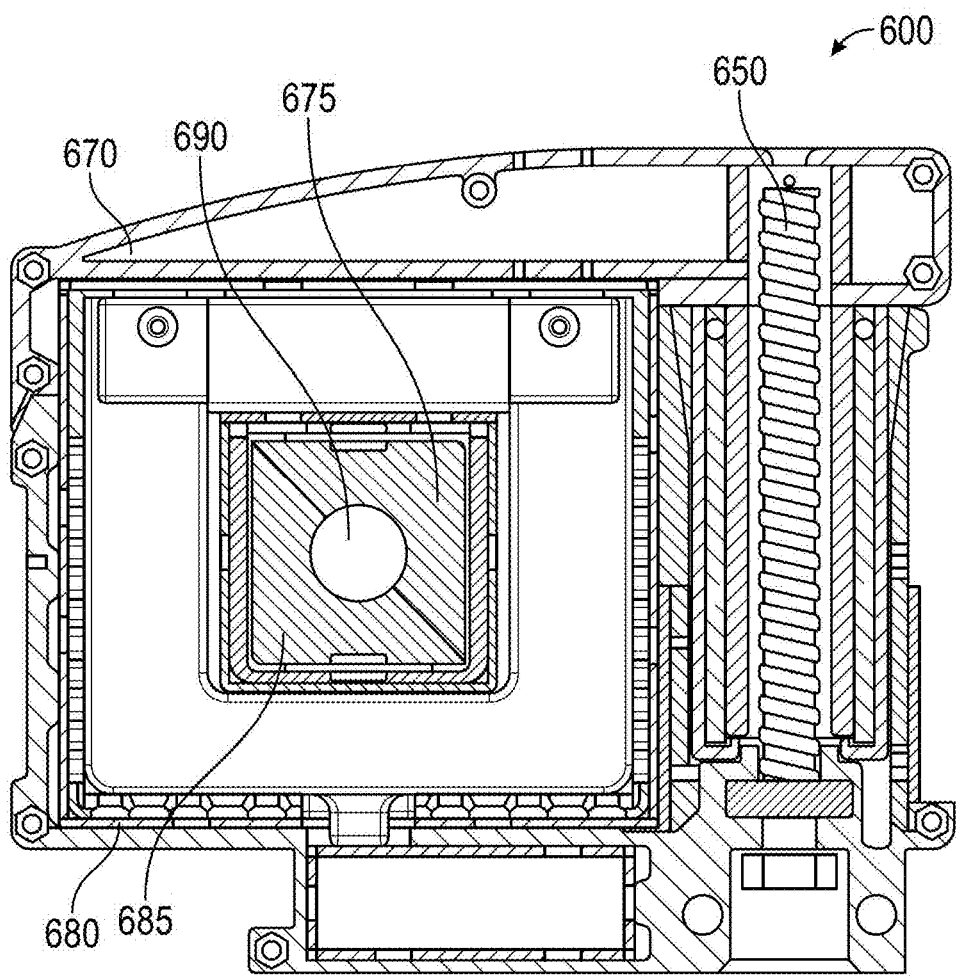
FIG. 8 shows a cross sectional view of the measuring head of FIGS. 6 and 7 in the closed configuration.

FIG. 8 shows a cutaway view of the primary sensing module shown in FIGS. 6 and 7 in the closed configuration. As can be seen in FIG. 8, the primary sensing module comprises a screw thread member by which rotational movement of the screw thread member 650 in a first direction causes the first and second jaws to move apart while rotational movement of the screw thread member in a second direction opposite the first direction causes the first and second jaws to move together.

Figure 9:
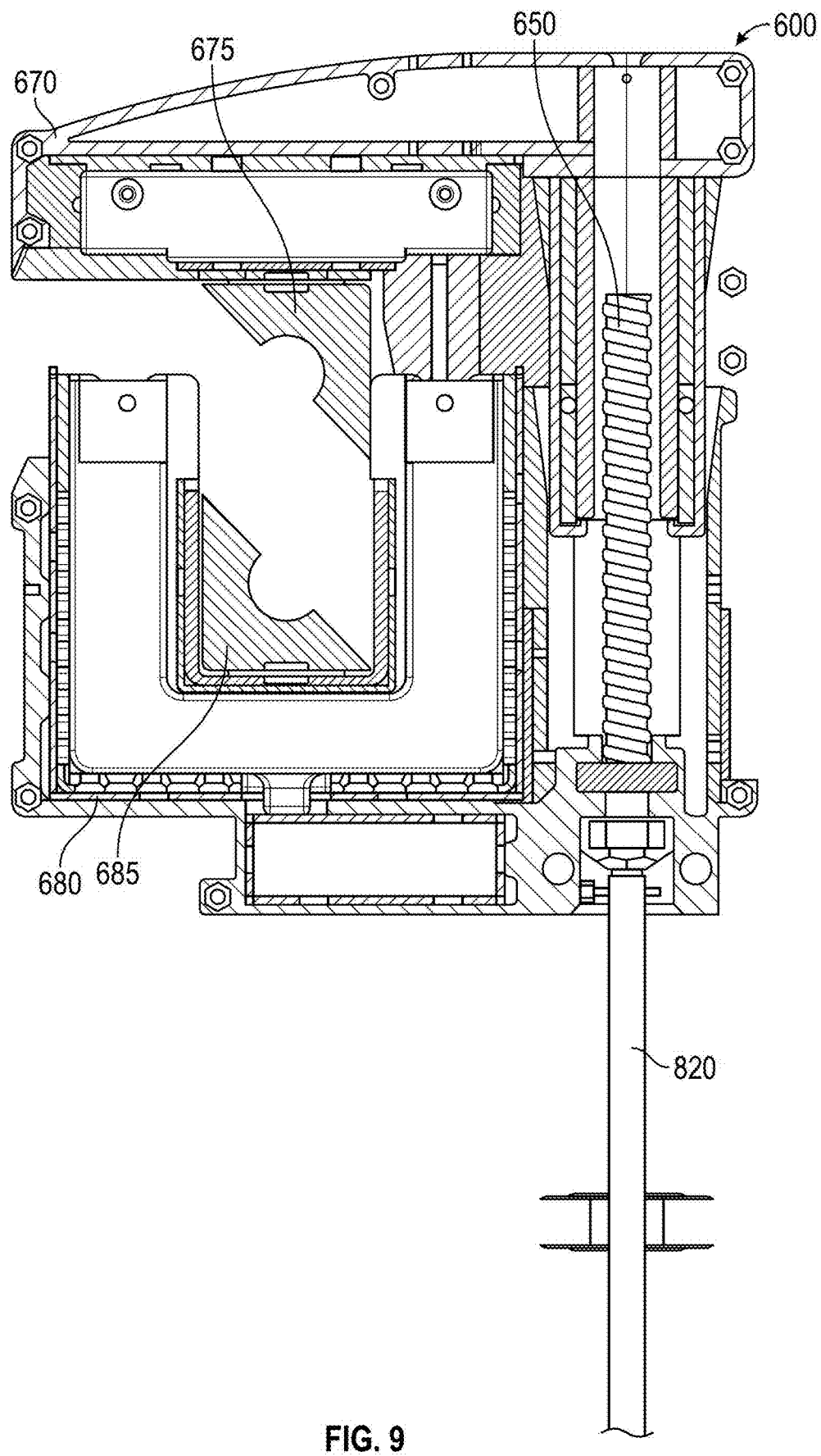
FIG. 9 shows a cross sectional view of the measuring head of FIGS. 6 to 8 in the open configuration.

FIG. 9 shows the sensing module 600 of FIG. 8 in an (at least partially) open configuration together with a rotational actuator 820 (that may be part of a mounting tool 800, explained further below) by which rotation of the screw thread member 650 may be actuated.

Rotation of the rotational actuator 820 in a first rotational direction (e.g. clockwise) results in movement of the jaws towards one another (until they meet) while rotation of the rotational actuator 820 in a second rotational direction (e.g. anticlockwise) that is opposite the first rotational direction results in movement of the jaws away from one another.

In use, the jaws may be separated using the rotational actuator 820 such that the jaws can be positioned with a conductor there between, wherein the jaws may be closed using the rotational actuator 820 until the conductor is accommodated by the aperture 690.

Figure 10:
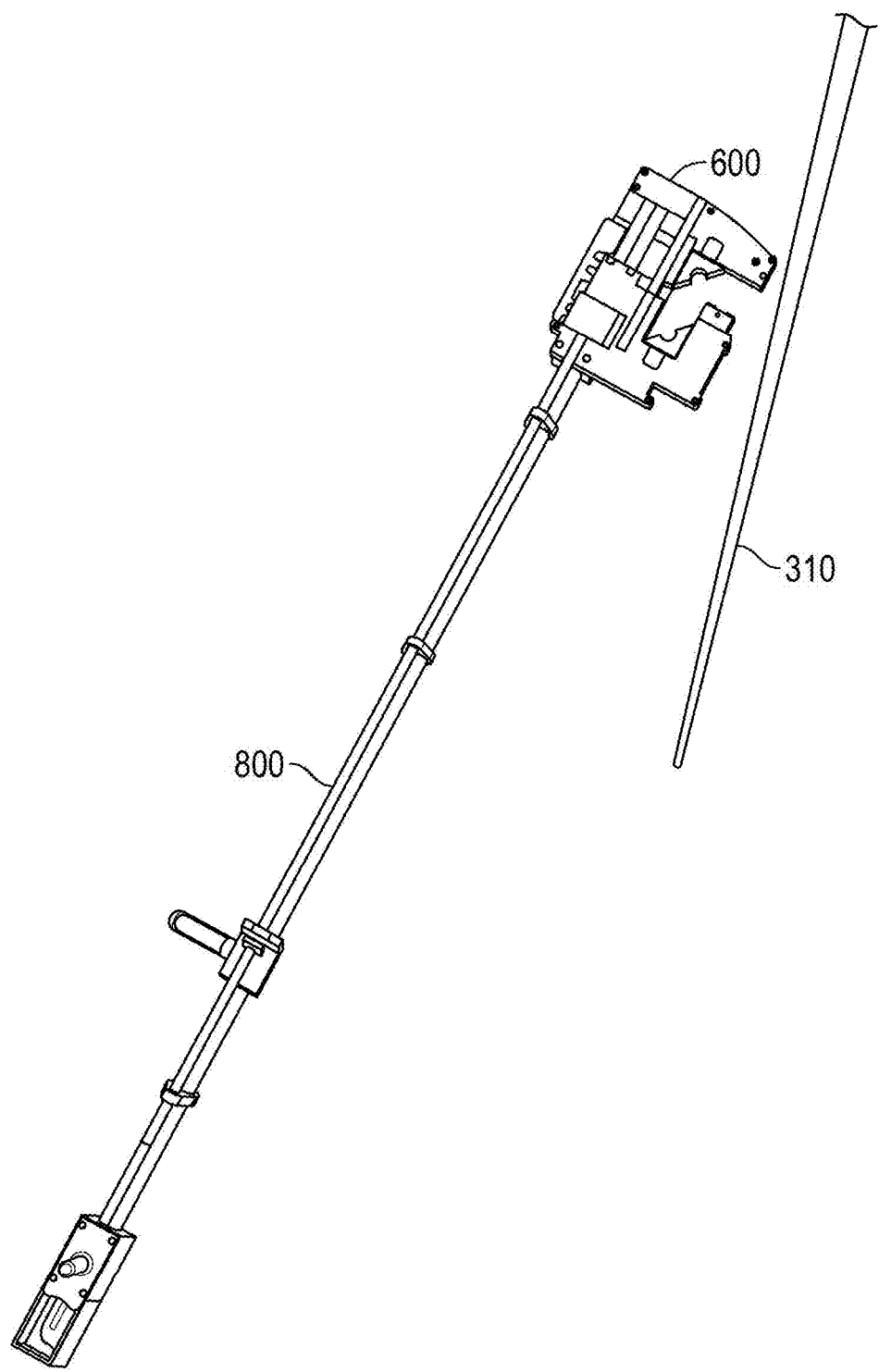
FIG. 10 shows the measuring head of FIGS. 6 to 9 together with a mounting tool, also in accordance with the present disclosure, for manipulating the measuring head and adjacent to a conductor whose current is to be sensed.

FIG. 10 shows a mounting tool 800 in accordance with the present disclosure together with the sensing module 600 with its jaws in the open configuration and a conductor 310 in preparation for attachment of the sensing module 600 to the conductor 310.

Figure 11:
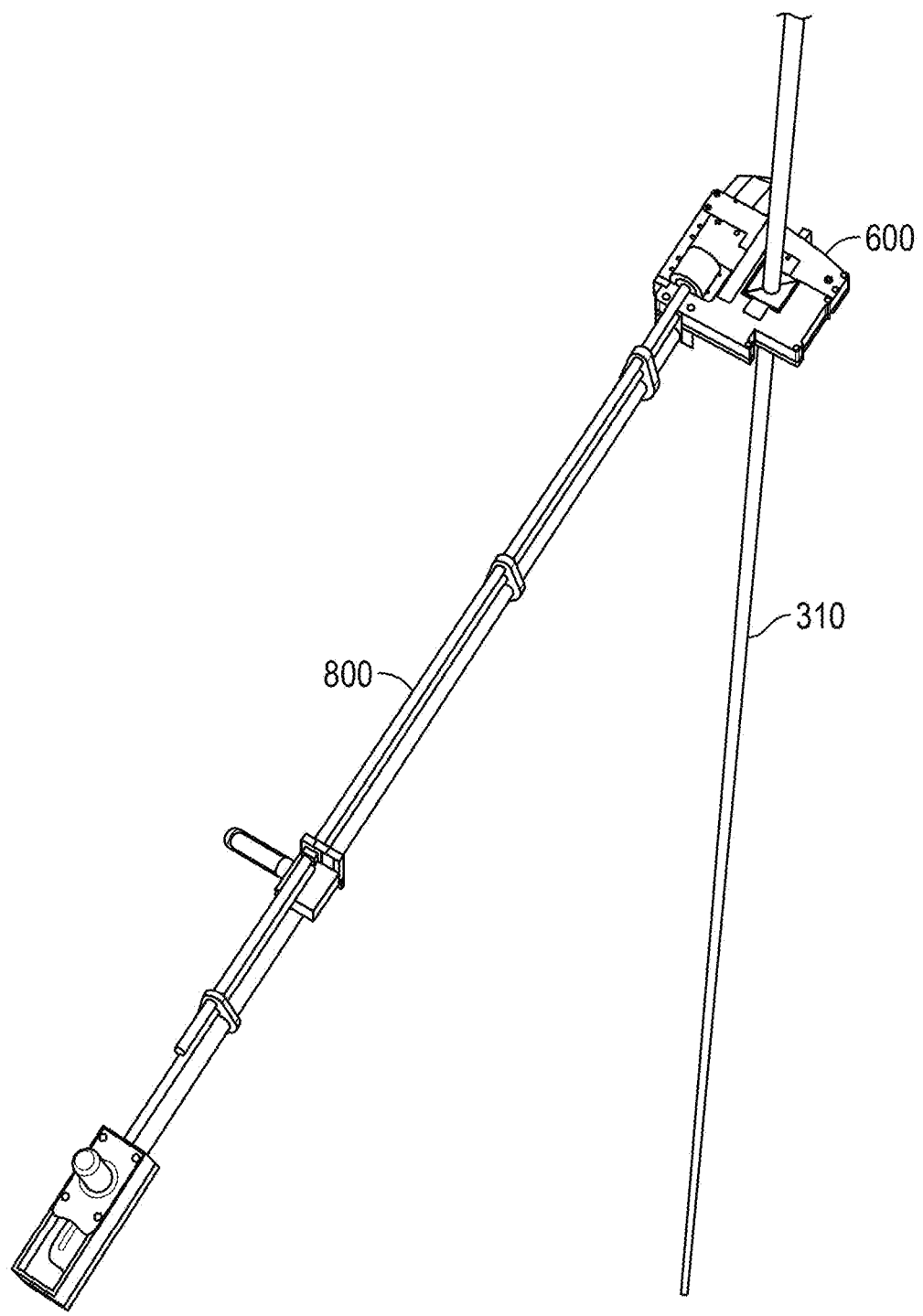
FIG. 11 shows the arrangement of FIG. 10 in a configuration wherein the measuring head is in the closed configuration around the conductor.

FIG. 11 shows the same elements as FIG. 10 with the jaws of the sensing module 600 in the closed configuration and surrounding the conductor 310 ready to perform the sensing.

Figure 12:
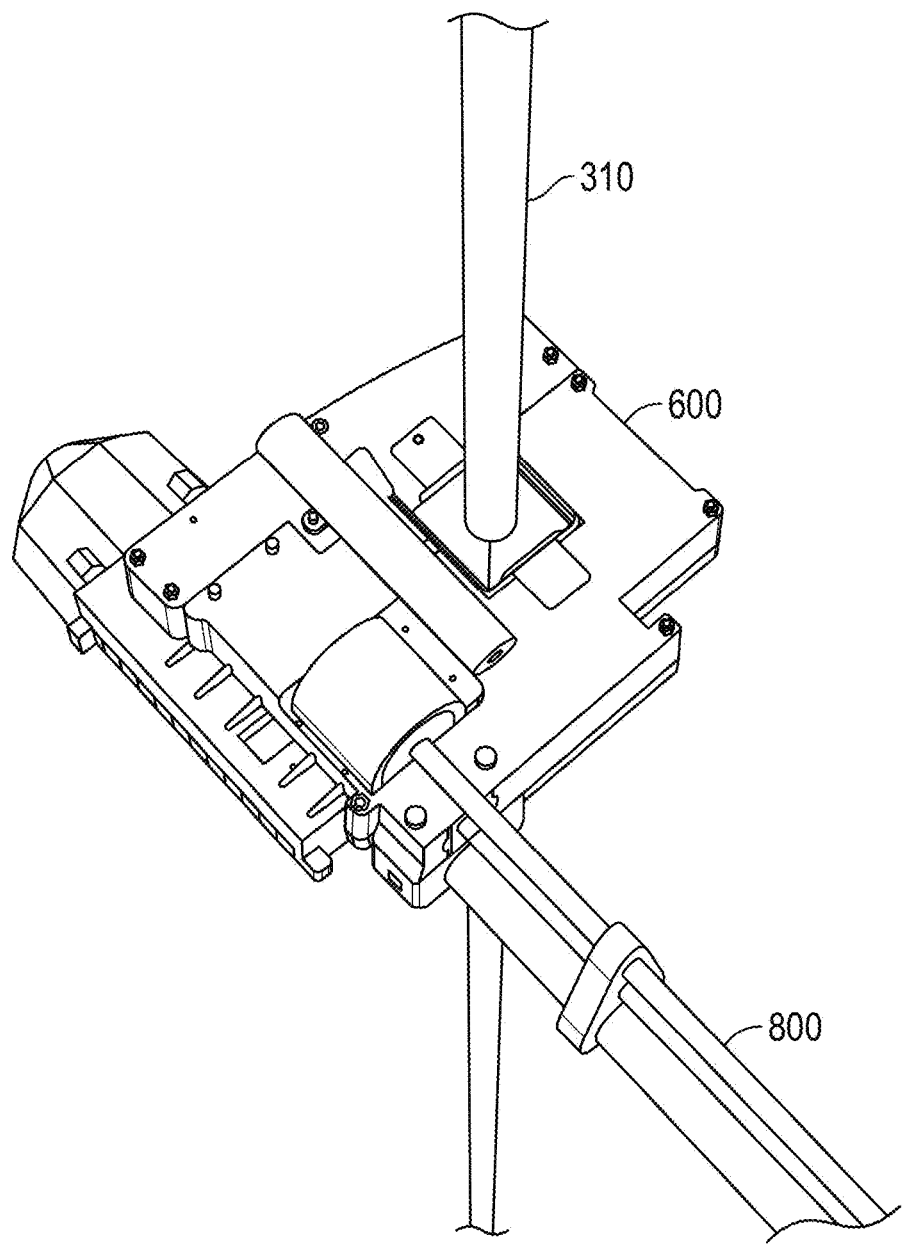
FIG. 12 shows the arrangement of FIG. 11 from a different perspective.

FIG. 12 shows an enlarged view of the sensing module 600 surrounding the conductor 310.

Figure 13:
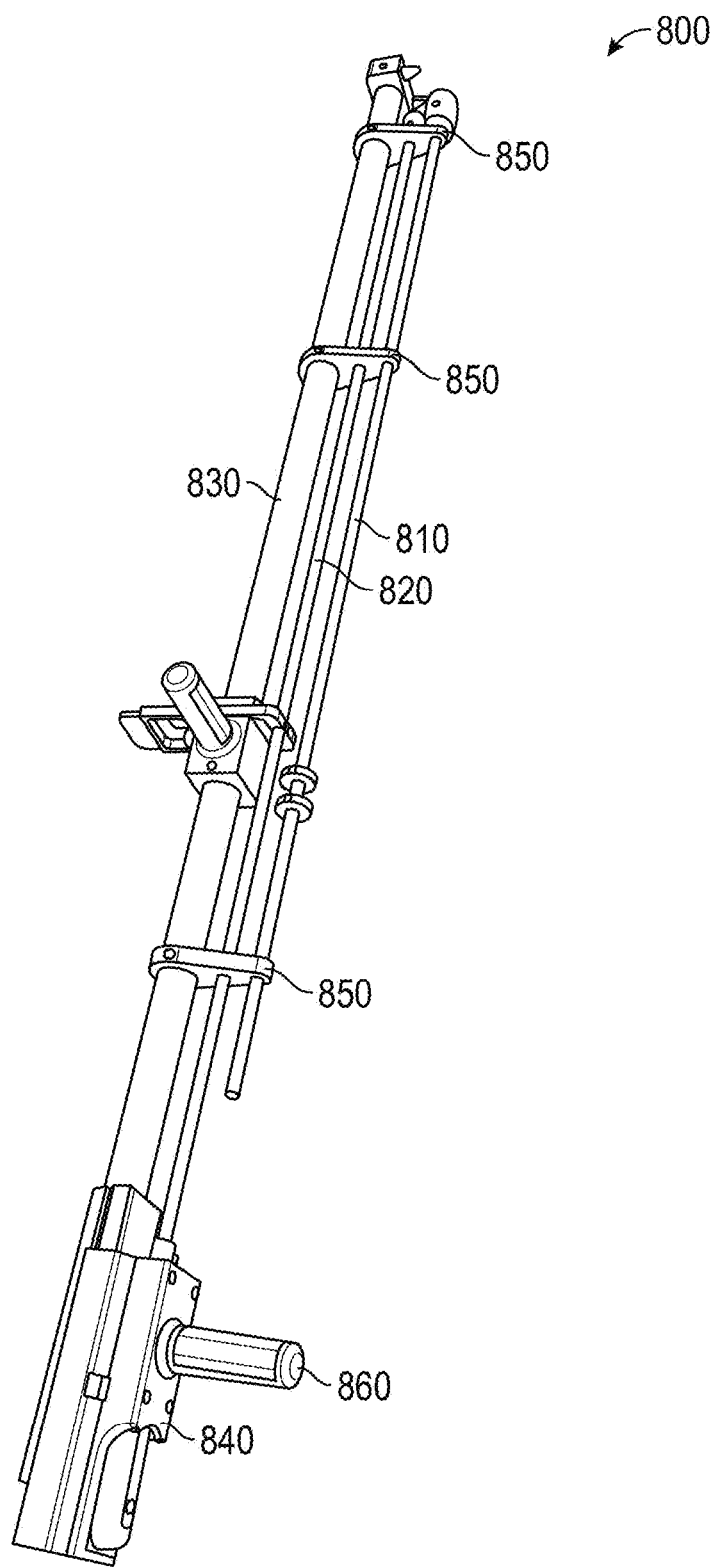
FIG. 13 shows a perspective view of the mounting tool.

FIG. 13 shows the mounting tool 800, which comprises a first rod 810 having a first axis, a second rod 820 having a second axis and a third rod 830 having a third axis, wherein the first, second and third axes are mutually parallel. The mounting tool 800 further comprises a housing 840, a handle 860 and a plurality of rod spacers 850 configured to maintain the first, second and third rods in their respective first, second and third axes. The second rod 820 is configured to be rotatable about the second axis. The housing 840 contains a motor (not illustrated) configured to rotate the second rod 820. The handle 860 projects from the housing 840.

Figure 14:
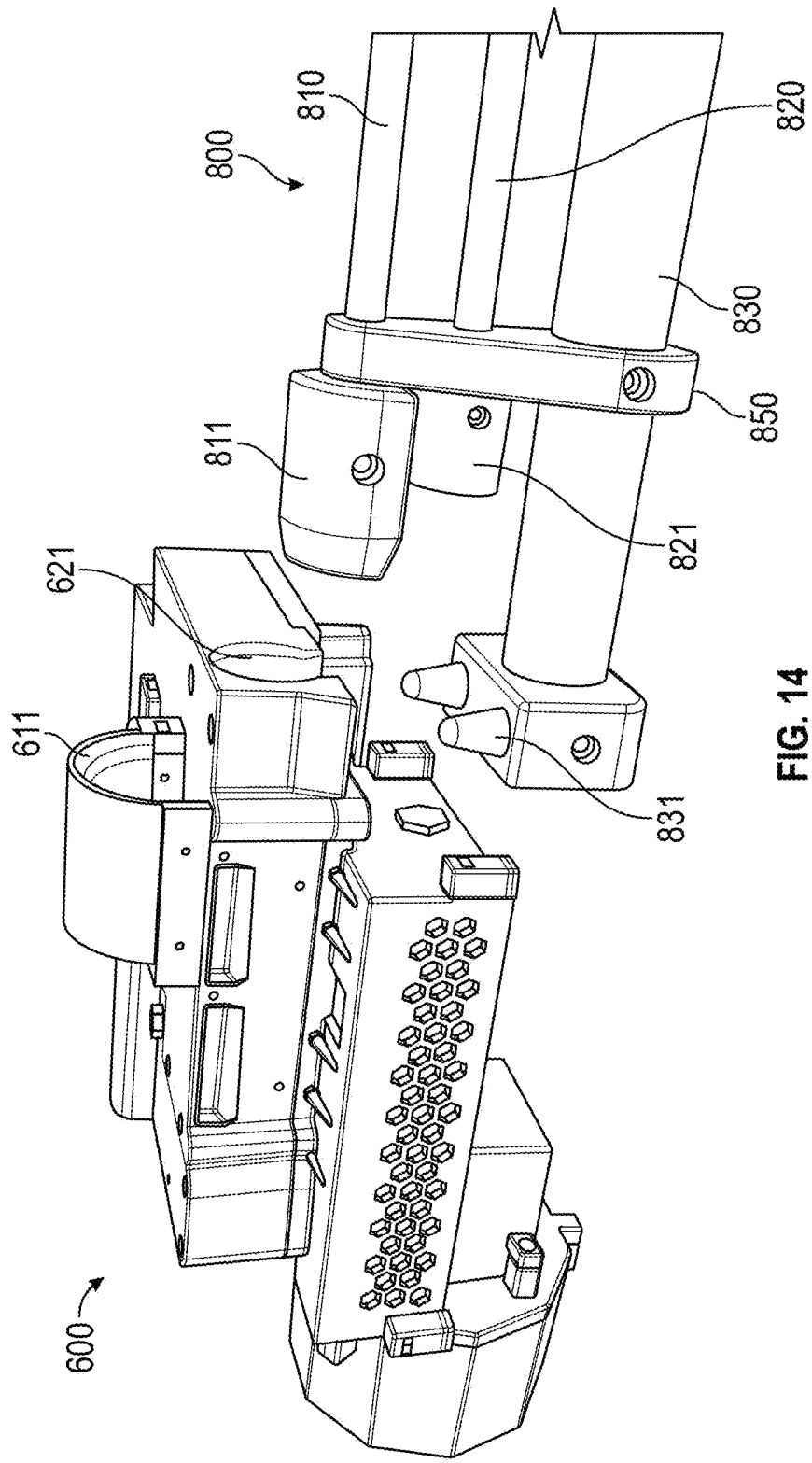
FIG. 14 shows a side view of the mounting tool adjacent to the measuring head.

FIG. 14 shows the mounting tool approaching the sensing module 600.

Referring to FIG. 14, the sensing module 600 comprises a first socket 611, a second socket 621 and a third socket (not visible in FIG. 14). Each of the first, second and third sockets is configured, respectively, to receive corresponding first engagement feature 811, second engagement feature 821 and third engagement feature 831, located at the ends of the first, second and third rods 810, 820, 830, furthest from the handle 860.

In use, the third engagement feature 831 is the first to engage with the sensing module 600. Movement of the mounting tool 800 in an upward direction in the orientation of FIG. 14 results in the third engagement feature 831 engaging with corresponding third socket (not visible in FIG. 14) such that on receipt the first and second axes align with an axis of the first socket 611 and an axis of the second socket 621, respectively. In this way, once the third engagement feature 831 is engaged with the third socket following the upward movement (relative to the orientation of FIG. 14), axial movement of the first and second rods 810, 820 results in the first and second engagement features 811, 821, being received by the first and second sockets 610, 620.

Figure 15:
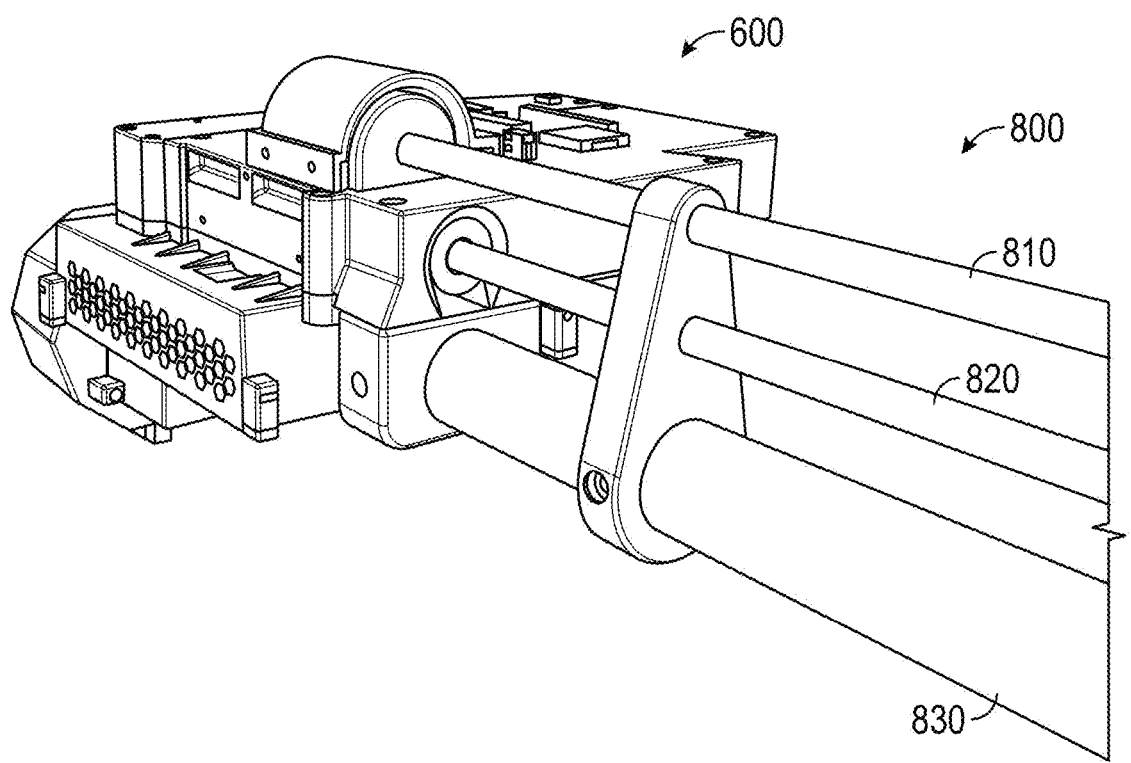
FIG. 15 shows a perspective view of the mounting tool engaging with the measuring head.

FIG. 15 shows the arrangement of FIG. 14 from a different perspective once the first, second and third sockets have all received their respective first, second and third engagement members.

In this way, the engagement of the third engagement feature 831 with the third socket prevents axial movement of the sensing module 600 relative to the third rod 830, while the engagement of the first engagement feature 811 with the first socket 611 prevents rotational movement of the sensing module 600 relative to the second rod 820. Engagement of the second engagement feature 821 with the second socket 621 enables rotation of the rotational actuator 650 by which the jaws are moved together and apart, depending upon the direction of rotation. The prevention of axial movement by the third engagement feature 831 and the prevention of rotational movement by the first engagement feature 811 (and potentially also to some degree by the third engagement feature 831) means that reliable rotational control can be achieved with sufficient stability such that the sensing module 600 can be carefully positioned to surround the conductor 310 while the jaws are closed around the conductor 310.

Disengagement of the sensing module 600 from the conductor 310 may be achieved by following the engagement steps in reverse.

While it may be that both the primary and the secondary sensing modules have a similar form, it may that the sensing module configured to measure the higher of the two currents on a high voltage has a form like that shown in FIGS. 6 to 9, while the sensing module configured to measure the lower current on a low voltage may be of a relatively simpler construction. This may be because the higher current conductor on a high voltage may be geometrically larger, physically less accessible, and therefore the sensing module for the higher current and high voltage may be more substantial, remotely mountable (e.g. using the mechanism shown in FIGS. 6 to 9) and may contain electromagnetic shieling of components, such as communication components, in order to prevent interference. By contrast, the lower current conductor on a low voltage may be geometrically smaller and physically more accessible. Accordingly, it may be appropriate that the sensing module configured to measure the lower current on a low voltage may not require remote mounting functionality and may have less electromagnetic shielding.

Figure 16:
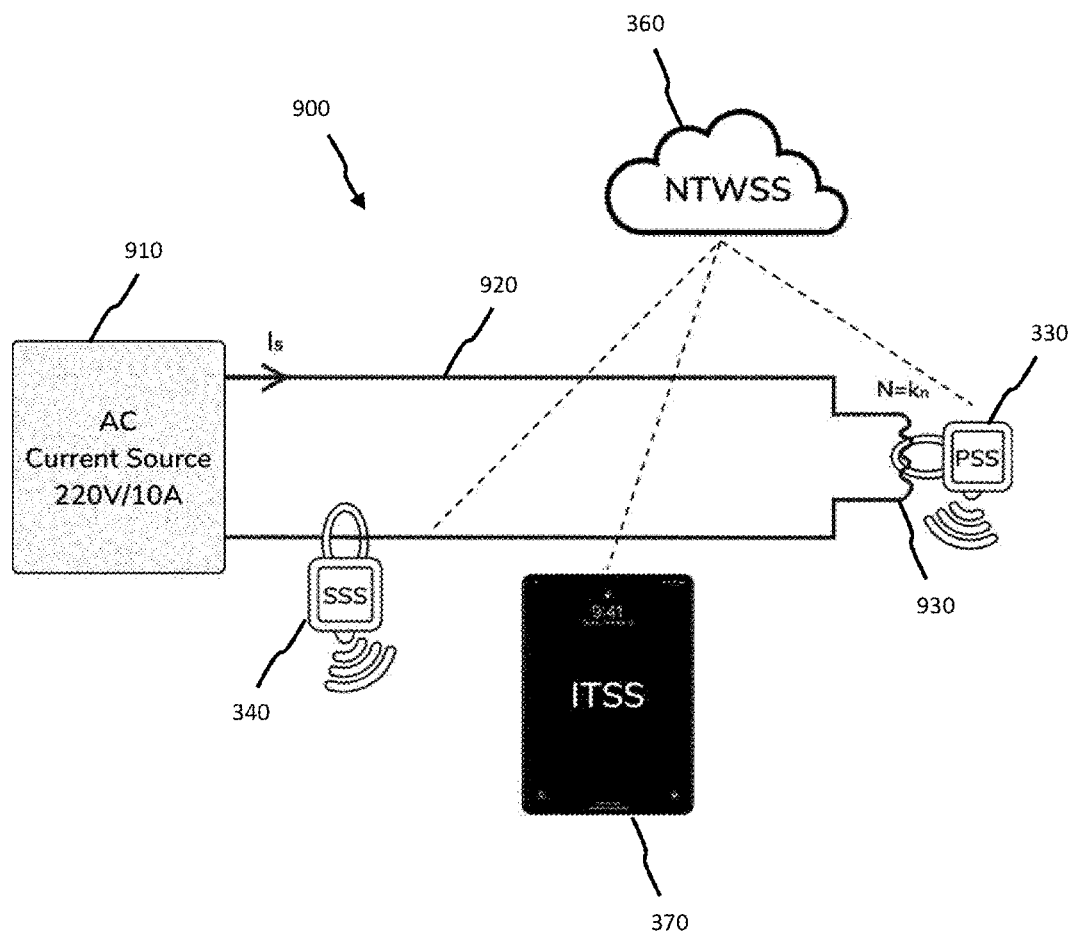
FIG. 16 shows a simplified electrical scheme by which calibration data for the pair of primary and secondary sensing modules may be obtained.

FIG. 16 shows a calibration rig that may be used to calibrate a pair of primary and secondary sensing modules. Given the high degree of precision required of the testing method, it is necessary to ensure that the sensing apparatus is correctly calibrated.

The calibration rig comprises an AC current source 910 and a series circuit 920 comprising a coil 930. The calibration process requires the primary sensing module 330 to sense the current in the coil 930 and requires the secondary sensing module 340 to be used simultaneously to sense the current elsewhere in the circuit 320. In this way, errors that derive from the measurement apparatus can be quantified and removed from the calculation of errors in the behaviour of the current transformer under test.

The coil (N=Kn) in FIG. 16 should ensure that the current flowing through the primary sensor is kn times greater than the current flowing through the secondary sensor.

So the coil with N=Kn turns simulates CTx with kn transformation ratio. The coil with N=kn acts as a standard transformer and may have a minor ratio error and a minor phase displacement error.

When the calibration is performed on the coil with N=kn turns, which has minor standard transformer errors, the errors of the test system are recorded. These errors are transmitted to a Software Error Compensation and Correction (SECC) block which may be located in the cloud 160, as shown in FIG. 1. The SECC then uses these error values when testing CTx with kn transformation ratio in real operating conditions to compensate for the known errors.

In a little more detail, as part of the calibration process, a series of timestamped upstream current data points and a series of timestamped downstream current data points are obtained in order to populate a calibration table (LUT-look up table) comprising rows and columns. The number of columns may be equal to the number of calibration points derived during the calibration process, wherein each calibration point may be at a different relative current in accordance with the current supplied by the AC current source 910. Each calibration point K, from the first (1) to the last (n) contains three data points: relative current at calibrated point k ($i_k$), ratio error of the system at calibration point k ($\varepsilon_k$), phase displacement error of the system at calibration point k ($\varphi_k$), respectively for each k∈ (1, n), a set of calibration values ($i_k$, $\varepsilon_k$, $\varphi_k$) is formed.

The number of calibration points (n) and the values of relative currents ($i_k$) may be arbitrarily chosen. Preferred values for n may be n=5, 10, 15, respectively, and $i_k$ values are minimum 0.05 and maximal 1.5 of the rated primary current.

An example of a calibration table with five calibration points is provided in Table 1:

TABLE 1

| $i_k$ [r.u.] | $I_s$ [A] | $\varepsilon_k$ [%] | $\varphi_\square$ [min] |
|---|---|---|---|
| 0.10 | 0.50 | −0.27 | 48.5 |
| 0.20 | 1.00 | −0.17 | 29.3 |
| 0.50 | 2.50 | 0.17 | −2.9 |
| 0.80 | 4.00 | 0.28 | −16.1 |
| 1.00 | 5.00 | 0.31 | −20.3 |

What follows is an explanation of how the calibration values may be used by the Software Error Compensation and Correction (SECC) to compensate for and correct for the known errors.

Figure 17A:
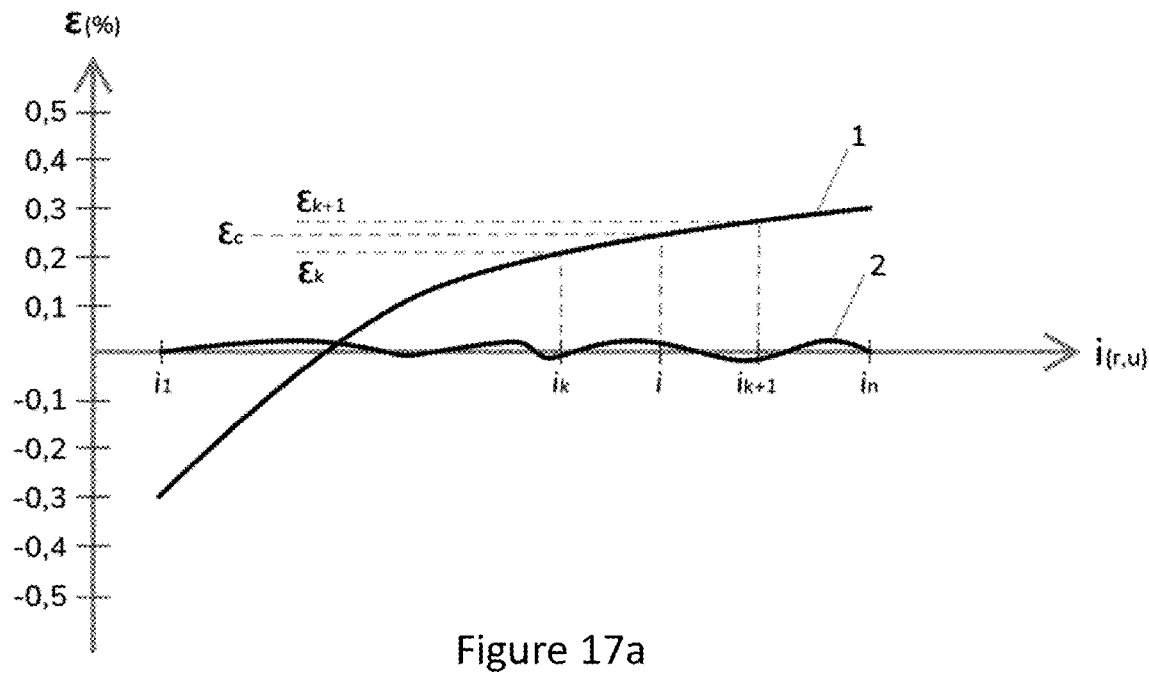
FIGS. 17a and 17b show calibration curves for ratio error and phase displacement error derived from a particular pair of primary and secondary sensing modules.
Figure 17B:
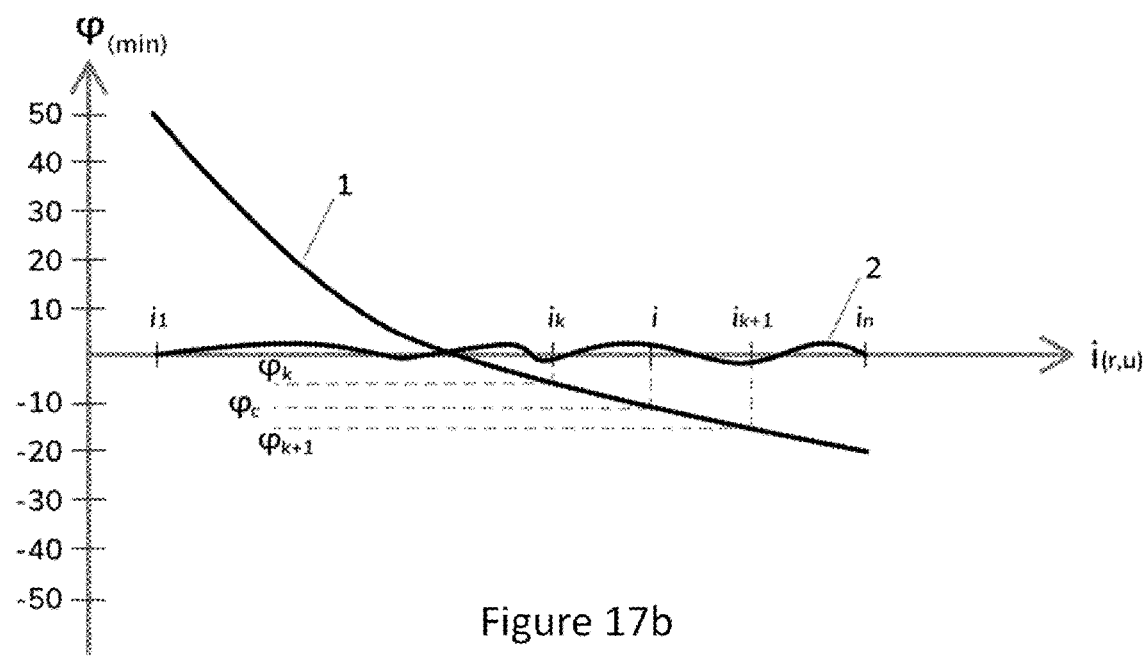

Compensation values $\varepsilon_c$ and $\varphi_c$ for an arbitrary relative value of the primary current (i=Ip/Ipn) are determined on the basis of a linear interpolation between two known successive calibration points from the calibration table (k and k+1) as shown on FIGS. 17a and 17b.

The real relative value of the primary current (i=Ip/Ion) may be $i_{k+1} \geq i \geq i_k$, where k is k-th calibration point.

Using linear interpolation as shown in FIGS. 17a and 17b, $\varepsilon_c$ and $\varphi_c$ are calculated as follows:

$$\text{for } i_{k+1} > i > i_k; \varepsilon_c = \varepsilon_k + \frac{\varepsilon_{k+1} - \varepsilon_k}{i_{k+1} - i_k}(i - i_k);$$

$$\varphi_c = \varphi_k + \frac{\varphi_{k+1} - \varphi_k}{i_{k+1} - i_k}(i - i_k);$$

$$\text{for } i = i_k; \varepsilon_c = \varepsilon_k; \varphi_c = \varphi_k,$$

$$\text{for } i = i_{k+1}; \varepsilon_c = \varepsilon_{k+1}; \varphi_c = \varphi_{k+1}$$

If i<$i_1$ linear extrapolation uses calibration points $i_1$ and $i_2$.
If i>$i_n$ linear extrapolation uses calibration points $i_{n-1}$ and $i_n$.

$$\varepsilon_{ctx} = \varepsilon_m - \varepsilon_c$$

$$\varphi_{ctx} = \varphi_m - \varphi_c$$

An exemplary data set for results of SECC is shown in Table 2:

TABLE 2

| i [r.u.] | $I_s$ [A] | $\varepsilon_m$ [%] | $\varphi_m$ [min] | $\varepsilon_c$ [%] | $\varphi_c$ [min] | $\varepsilon_{CTx}$ [%] | $\varphi_{CTx}$ [min] |
|---|---|---|---|---|---|---|---|
| 0.15 | 0.75 | −0.21 | 38.0 | −0.22 | 38.9 | 0.01 | −0.9 |
| 0.60 | 3.00 | 0.24 | −8.0 | 0.21 | −7.3 | 0.03 | −0.7 |
| 1.20 | 6.00 | 0.38 | −25.8 | 0.34 | −24.5 | 0.04 | −1.30 | where:
$\varepsilon_m$ and $\varphi_m$—measured values of ratio and phase displacement error,
$\varepsilon_c$ and $\varphi_c$—compensation values of ratio and phase displacement error,
$\varepsilon_{CTx}$ and $\varphi_{CTx}$-values of ratio and phase displacement error of current transformer under test.

In FIG. 17a, curve 1 represents the ratio error of the test system before calibration and curve 2 represents ratio error of the test system after calibration as a function of relative current.

In FIG. 17b, curve 1 represents the phase displacement error of the test system before calibration and curve 2 represents phase displacement error of the test system after calibration as a function of relative current.

The authors have demonstrated through a large number of experiments that the proposed methodology of calibration and correction improves the accuracy of the test system for the entire order of magnitude.

In one exemplary configuration, a test is performed on a high voltage (110 kV) current transformer CTx that is configured to transform 400 A at 110 kV to 5 A at 220 V. In this case, a primary sensing module is selected appropriate to sense the high current 400 A on a high voltage side (110 kV) of the transformer under test and a secondary sensing module is selected appropriate to sense 5 A on a low voltage side (220V) of the current transformer under test.

The sensors of the primary and secondary sensing modules are selected (110) to match with CTx. The sensor in the primary sensing module may be a split core current transformer 400 A to 1 V, accuracy class 0.2S as defined in IEC 61869-1. The sensor in the secondary sensing module may be asplit core current transformer 5 A to 1 ,V accuracy class 0.2S as also defined in IEC 61869-1. In this scenario, a user would select the measurement parameter input data via the mobile device, wherein Knctx=400/5 and kns=400/5.

Calibration 120 is carried out using the selected primary and secondary sensing module on the calibration rig shown in FIG. 16, with N=80 turns.

The FIG. 16 arrangement has negligible ratio and phase displacement errors so $\varepsilon_{ctx} \approx 0$ and $\varphi_{ctx} \approx 0$ so, in calibration points, $\varepsilon_k \approx \varepsilon_m$ and $\varphi_k \approx \varphi_m$.

Using the AC current source 910, the relative current $i_k$ is adjusted. For example, for the first calibration point the relative current $i_k$=0.10 r.u. may be adjusted and the ratio error and the phase displacement error are measured as $\varepsilon_k$=−0.27% and $\varphi_k$=48.5 min. For the last calibration point, $i_k$=1.0 r.u. is adjusted and the ratio error and the phase displacement error are measured as $\varepsilon_k$=0.31% and $\varphi_k$=−20.3 min. (The full data are shown in Table 1 above.)

It should be noted that the calibration need not be carried out immediately before a test. Indeed, it may be carried out only infrequently.

Following calibration (where performed), the primary and secondary sensing modules are removed from the calibration rig and applied to the current transformer under test, in accordance with the arrangement shown in FIG. 3. Using a so-called hot stick principle, the primary sensing module 330 is mounted on high voltage energized conductor 310, and the secondary sensing module is mounted on low voltage energized conductor 320.

Once the primary and secondary sensing modules are in their respective positions on either side of the current transformer under test, the timestamped upstream and downstream current data points are derived using the primary and secondary sensors of the primary and secondary sensing modules, and measured ratio error and phase displacement error and relative current are calculated.

Next the calibration data is used to remove the known errors derived via the calibration process.

In this way, highly accurate ratio and phase displacement errors for the current transformer under test may be obtained.

Examples of measured results for relative current, ratio and phase displacement error (with the known measurement errors derived from the calibration data removed) for the example current transformer under test are shown in Table 3.

TABLE 3

| i [r.u.] | $\varepsilon_{CTx}$ [%] | $\varphi_{CTx}$ [min] |
|---|---|---|
| 0.31 | 0.44 | 15.7 |
| 0.32 | 0.44 | 15.1 |
| 0.31 | 0.43 | 14.9 |
| 0.32 | 0.43 | 15.2 |
| 0.31 | 0.44 | 15.3 |

Measured data from secondary sensing module may be encrypted by the secondary sensing module, transmitted to the mobile device 150, and processed further using the cloud platform 160, and may then subsequently be made available to the user 170 from the cloud 160.

After the test has been carried out, the primary and secondary sensing modules may be dismantled from the energized conductors, and the procedure can be repeated on other current transformers of the same transformation ratio using the same primary and secondary sensing modules.

The invention claimed is:

1. An online live line method of analysing metrological properties of a high voltage current transformer configured to transform an upstream current into a downstream current, the method comprising:
   obtaining a series of upstream current data points during a first time period using an upstream current sensor;
   attributing an upstream time stamp provided by an upstream global navigation satellite system (GNSS) signal receiver to each one of the series of upstream current data points to obtain a time-stamped series of upstream current data points;
   obtaining a series of downstream current data points during the first time period using a downstream current sensor;
   attributing a downstream time stamp provided by a downstream global navigation satellite system (GNSS) signal receiver to each one of the series of downstream current data points to obtain a time-stamped series of downstream current data points;
   calculating a current transformer phase displacement error between the time-stamped series of upstream current data points and the time-stamped series of downstream current data points;
   calculating a current transformer ratio error by comparing a rated ratio of the current transformer with a measured ratio determined using the time-stamped series of upstream current data points and the time-stamped series of downstream current data points.

2. The method of claim 1 wherein the measured ratio is a ratio of:
   a root mean square value of the series of upstream data points; to
   a root mean square value of the series of downstream data points.

3. The method of claim 1 wherein the current transformer phase displacement error is proportional to a time difference between at least one pair of successive zero crossings of time stamped upstream current data and time stamped downstream current data, wherein accuracy of time reference is less than 100 nanoseconds and preferably approximately 10 nanoseconds.

4. The method of claim 1 wherein each of the stream of upstream current data points and the stream of downstream current data points comprises at least 20,000 data points per AC cycle, preferably 40,000 data points per AC cycle.

5. The method of claim 1 further comprising compensating for measurement errors derived via a calibration process.

6. The method of claim 5 wherein the calibration process comprises:
using the upstream current sensor to sense a current in a calibration coil of a calibration circuit;
using the downstream current sensor to a sense a current in a conductor of the calibration circuit, the conductor being in series with the calibration coil,
thereby to determine ratio error and phase displacement error arising from the pairing of the upstream and downstream current sensors.

7. The method of claim 5 further comprising a step of removing error values determined via the calibration process from measured data of the current transformer under test in order to achieve corrected data values, wherein optionally the step of removing error values is carried out by a cloud server.

8. The method of claim 1 further comprising one or both of:
hot stick mounting the upstream current sensor on an upstream conductor upstream of the current transformer, including the provision of electro-magnetic shielding to protect the upstream current sensor;
hot stick mounting the downstream current sensor on a downstream conductor downstream of the current transformer, including the provision of electro-magnetic shielding to protect the downstream current sensor.

9. An electrical measurement apparatus for online live line analysis of metrological properties of a current transformer, the apparatus comprising:
a primary sensing module comprising:
a primary sensor configured to measure a primary current in a primary conductor of a current transformer in order to obtain a series of primary current data points; and
a primary global navigation satellite system (GNSS) signal receiver configured to attribute a primary GNSS time stamp to each one of the series of primary current data points to obtain a primary series of time stamped data points; and
a secondary sensing module comprising:
a secondary sensor configured to measure a secondary current in a secondary conductor of the current transformer in order to obtain a series of secondary current data points; and
a secondary GNSS signal receiver configured to attribute a secondary GNSS time stamp to each one of the series of secondary current data points to obtain a secondary series of time stamped data points;
wherein the primary sensing module is configured to transmit the primary series of time stamped data points to the secondary sensing module; and
wherein the secondary sensing module is configured:
to receive the primary series of time stamped data points;
to generate aggregated data comprising both the primary series of time-stamped data points and the secondary series of time-stamped current data points; and
to output the aggregated data.

10. The measurement apparatus of claim 9 wherein the primary sensing module is configured to be hot stick mounted on an energized high voltage conductor, to sense a higher current than the secondary sensing module and wherein the primary sensing module comprises electromagnetic shielding and wherein, optionally, the secondary sensing module comprises electromagnetic shielding.

11. The measurement apparatus of claim 9 wherein:
the primary sensing module comprises a primary wireless transmitter configured to transmit the primary series of time stamped data points to the secondary sensing module; and
the secondary sensing module comprises a secondary wireless receiver configured to receive the primary series of time stamped data points from the secondary sensing module.

12. The measurement apparatus of claim 9 wherein:
the secondary sensing module comprises a secondary wireless transmitter configured to transmit the aggregated data and/or to transmit the ratio error and the phase displacement error.

13. A measuring head for measuring an electrical property of a conductor, comprising:
a sensor configured to measure the electrical property;
an upper jaw;
a lower jaw;
a mechanism for opening and closing the upper and lower jaws;
a first connecting element configured for connecting a rotatable rod;
a second connecting element configured for connecting a non-rotatable rod;
wherein the upper and lower jaws are configured to grasp the conductor in a closed position and to release the conductor in an open position; and
wherein the opening and closing of the jaws is actuated by rotation of the rotatable rod, and
wherein the measuring head further comprises electromagnetic shielding to enable hot stick mounting on an energized power line conductor on a high voltage side of current transformer under test.

14. The measuring head of claim 13 wherein the sensor comprises an electric current sensor of a split core current transformer type, and wherein optionally the measuring head is configured to facilitate substitution of the sensor.

15. The measuring head of claim 13 wherein, in the closed position, an aperture between the upper and lower jaws is configured to accommodate the conductor and to provide appropriate positioning of the conductor.

16. The measuring head of claim 15 wherein the aperture is formed at least in part by a first removable insert of a first one of the upper jaw and the lower jaw; and wherein optionally:
the first removable insert is interchangeable with a range of first removable inserts so as to facilitate a range of aperture shapes and sizes.

17. The measuring head of claim 16 wherein the aperture is formed at least in part by a second removable insert of a second one of the upper jaw and the lower jaw.

18. The measuring head of claim 17 wherein the second removable insert is interchangeable with a range of second removable inserts so as to facilitate a range of aperture shapes and sizes.

19. The measuring head of claim 13 wherein the first connecting element and the second connecting element together form a poka-yoke arrangement so as to prevent opposite engagement of first and second connecting elements by external engagement elements.

* * * * *